United States Patent
Ohama et al.

(10) Patent No.: US 6,841,210 B2
(45) Date of Patent: Jan. 11, 2005

(54) MULTILAYER STRUCTURED QUARTZ GLASS CRUCIBLE AND METHOD FOR PRODUCING THE SAME

(75) Inventors: Yasuo Ohama, Takefu (JP); Hiroshi Matsui, Takefu (JP)

(73) Assignees: Heraeus Quarzglas GmbH & Co., KG, Hanau (DE); Shin-Etsu Quartz Products Co., Tokyo (JP)

( * ) Notice: Subject to any disclaimer, the term of this patent is extended or adjusted under 35 U.S.C. 154(b) by 0 days.

(21) Appl. No.: 10/048,677

(22) PCT Filed: May 31, 2001

(86) PCT No.: PCT/EP01/06180
§ 371 (c)(1),
(2), (4) Date: Jul. 11, 2002

(87) PCT Pub. No.: WO01/92609
PCT Pub. Date: Dec. 6, 2001

(65) Prior Publication Data
US 2002/0192409 A1 Dec. 19, 2002

(30) Foreign Application Priority Data
May 31, 2000 (JP) ........................................ 2000-163645

(51) Int. Cl.[7] .......................... B65D 13/02; B32B 17/06; C30B 13/14; C30B 15/10; F27B 14/10
(52) U.S. Cl. ..................... 428/34.4; 428/34.6; 428/428; 428/426; 428/34.1; 117/200; 117/204; 117/206; 432/262; 432/263; 432/264; 432/265; 432/156; 432/157; 432/158; 422/245.1; 422/908
(58) Field of Search ................. 428/34.4, 34.6, 428/34.1, 426, 428; 65/68–81, DIG. 8; 117/200–224; 432/262–265, 156–158; 422/245.1, 908; 501/133, 154

(56) References Cited

U.S. PATENT DOCUMENTS

| | | | | |
|---|---|---|---|---|
| 4,528,163 A | * | 7/1985 | Albrecht | ..................... 117/208 |
| 5,306,473 A | * | 4/1994 | Nakajima et al. | ........... 117/208 |
| 5,885,071 A | | 3/1999 | Watanabe et al. | |
| 5,895,527 A | * | 4/1999 | Taguchi et al. | ............. 117/200 |
| 5,913,975 A | * | 6/1999 | Holder | ........................ 117/206 |
| 6,306,489 B1 | * | 10/2001 | Hellmann et al. | ........ 428/312.6 |
| 6,312,775 B1 | * | 11/2001 | Nagata et al. | ............. 428/34.6 |
| 6,548,131 B1 | * | 4/2003 | Fabian et al. | ............... 428/34.4 |

FOREIGN PATENT DOCUMENTS

| | | |
|---|---|---|
| EP | 0 911 429 A | 4/1999 |
| FR | 2 461 028 A | 1/1981 |
| JP | 59017242 A * | 1/1984 ........... H01L/21/22 |

OTHER PUBLICATIONS

Patent abstracts of Japan for JP 2000–016896, Jan. 18, 2000 (Aug. 31, 2000).

Patent abstracts of Japan for JP 11–116374A, Apr. 27, 1999 (Jul. 30, 1999).

Patent abstracts of Japan for JP 2000–159593A, Jun. 13, 2000 (Oct. 13, 2000).

* cited by examiner

*Primary Examiner*—Harold Pyon
*Assistant Examiner*—Chris Bruenjes
(74) *Attorney, Agent, or Firm*—Tiajoloff & Kelly

(57) ABSTRACT

Disclosed is a multilayer structured quartz glass crucible, for pulling up silicon single crystal, whose structure has at least three layers comprising: a translucent outer layer made of naturally occurring quartz glass and having a large number of pores, a translucent intermediate layer, made of synthetic quartz glass and having a large number of pores, and a transparent inner layer substantially free from pores and made of a synthetic quartz glass. Thermal convection within the silicon melt is suppressed by use of the quartz glass crucible, thereby preventing oscillation on the surface of the silicon melt. A method for producing the quartz glas crucible is also disclosed.

14 Claims, 3 Drawing Sheets

MULTILAYER STRUCTURED QUARTZ GLASS CRUCIBLE AND METHOD FOR PRODUCING THE SAME

TECHNICAL FIELD TO WHICH THE INVENTION BELONGS

The present invention relates to a multilayer structure quartz glass crucible favorably used in pulling up single crystal silicon for use in the production of semiconductors, and to a method for producing said quartz glass crucible.

RELATED ART

In the production of a single crystal silicon in accordance with the Czochralski (CZ) process, commonly used heretofore is a quartz glass crucible as a vessel for placing therein a silicon melt. Generally, the quartz glass crucible is produced by molding it inside a mold by using a quartz powder produced by crushing and purifying a naturally occurring (crystalline) quartz, followed by fusing it by arc heating. The quartz glass crucible produced in accordance with the method above is obtained by supplying a powder of quartz raw material inside a rotating mold, then depositing it on the inner wall of the mold by taking advantage of the centrifugal force to form a mold body in the shape of the crucible, and heating and fusing the mold body from the inside by means of arc discharge. Hence, the inner surface of the mold thus obtained is smooth, and the entire body exhibits a translucent outer appearance.

The translucent quartz glass crucible thus obtained contains numerous fine pores at high density inside the body, and hence, it has a function of homogenizing the thermal conductance in case single crystal silicon is pulled up while heating the inside of the crucible from an external heating source. Thus, it has been considered indispensable that the crucible has a smooth inner surface contacted with a silicon melt and numerous pores.

It has been confirmed that a crucible having excellent properties for pulling up single crystal silicon not only should have a smooth inner surface, but that such a crucible can be obtained by preparing a quartz glass crucible having a double layered structure by providing a substantially pore-free transparent layer for a predetermined thickness (about 0.5 to 2 mm thick) from the smooth inner surface, and a translucent layer containing numerous pores as described above for the outer side. The structure of such a crucible and the method for producing the same are already proposed (see, for instance, Japanese Patent Publication No. 22861/1992, Japanese Patent Publication No. 29871/1995, Japanese Patent Publication No. 42193/1995).

The method for producing the quartz glass crucible above consists of a step of forming an outer layer (base body) comprising supplying a silicon dioxide powder inside a rotating mold to form a molded body in the shape of the crucible, followed by heating and fusing the quartz powder to form a translucent quartz glass crucible outer layer (base body); and a step of forming the inner layer comprising, while or after forming the crucible outer layer (base body), newly supplying a silicon dioxide powder into the heated atmosphere inside said crucible outer layer (base body) to form a transparent quartz glass crucible inner layer on the inner plane side of said crucible outer layer.

Furthermore, with the recent trend in single crystal silicon of increasing the diameter and reducing defects therein, the quartz glass crucible has been required to be more purified. Thus, the present applicants proposed to provide the inner layer of the quartz glass crucible having the double layered structure having the transparent inner layer and the translucent outer layer, as described above, by using a synthetic quartz powder as the raw material therefor (see, for instance, Japanese patent applications Nos. 2811290, 2933404).

The quartz glass crucible having an inner layer made from the synthetic quartz glass above contains extremely low amount of impurities, and is greatly reduced in the generation of surface roughening on the inner plane of the crucible and of cristobalite spots during pulling up a single crystal silicon. Accordingly, the crucible is advantageous in that it enables an elongated operation as compared with a crucible having an inner layer made from a naturally occurring quartz glass.

However, as compared with a crucible having an inner layer made from a naturally occurring quartz glass, the crucible above comprising the inner layer made from a synthetic quartz glass is known apt to generate a phenomenon as such that, the melt surface causes oscillation in case polysilicon is molten therein. When the melt surface causes oscillation, difficulties are found in the operation of immersing a seed crystal, and this requires a longer time for the so-called "seeding" operation, thereby resulting in a decrease in productivity, or leading to problems such as causing disordering to the single crystal ingot during its pulling up.

As a mechanism of generating oscillation on the surface of the melt, presumed is an increase in the generation of gaseous SiO in case the reaction at the contact portion between the inner plane of the quartz glass crucible, i.e., the surface of the quartz glass, and the surface of the silicon melt is activated by some effect, thereby making the melt easily repelled from the surface of the quartz glass, and generating oscillation on the surface of the melt.

Based on the above presumption, a crucible was proposed having a high IR transmittance (see Japanese patent application Hei11-22883). In the referred patent application, there is described that an increase in IR transmittance lowers the temperature inside the quartz glass crucible, and that the above reaction can be thereby suppressed to relatively decrease the oscillation of the melt surface.

PROBLEMS THE INVENTION IS TO SOLVE

In the light of the aforementioned circumstances, it was found that, in addition to lowering the temperature inside the quartz glass crucible, a reduction of the temperature difference depending on the position of the inner surface of the quartz glass crucible suppresses the heat convection inside the silicon melt. Hence, the reaction at the contact portion between the silicon melt and the surface of the quartz glass crucible can be further suppressed. The present invention has been accomplished based on these findings.

That is, an object of the present invention is to provide a multilayer structured quartz glass crucible for use in pulling up silicon single crystal by constituting the quartz glass crucible with a structure having at least three layers comprising a translucent outer layer made of naturally occurring quartz glass and having a large number of pores, a translucent intermediate layer made of synthetic quartz glass and having a large number of pores, and a transparent inner layer substantially free from pores and made of a synthetic quartz glass, thereby suppressing thermal convection within the silicon melt and thereby preventing oscillation from occurring on the surface of the melt. It is also an object of the present invention to provide a method for producing the quartz glass crucible above.

MEANS FOR SOLVING THE PROBLEMS

In order to achieve the objects above, the present invention provides a multilayer structured quartz glass crucible comprising at least three layers of a translucent outer layer made of naturally occurring quartz glass, a translucent intermediate layer made of synthetic quartz glass, and a transparent inner layer made of synthetic quartz glass.

The translucent layer of the quartz glass crucible according to the present invention relates to a quartz glass layer containing numerous pores and having a translucent outer appearance, and the transparent layer relates to a transparent quartz glass layer substantially free from pores.

The translucent synthetic quartz glass layer above yields a relatively low IR transmittance as compared with a translucent naturally occurring quartz glass layer, and is capable of further relaxing the temperature distribution generated by an external heat source. Accordingly, by providing a translucent intermediate layer made of a synthetic quartz glass between a translucent outer layer made of a naturally occurring quartz glass and a transparent inner layer made of a synthetic quartz glass, the temperature difference depending on the position of the inner plane of the quartz glass crucible can be minimized, and hence the thermal convection of the silicon melt can be suppressed. As a result, the reaction at the contact portion between the surface of the quartz glass crucible and the silicon melt can be reduced as to suppress the oscillation in the melt surface.

In the present invention, the term "naturally occurring quartz glass" refers to a quartz glass obtained by using naturally occurring silica as the raw material, and, similarly, "synthetic quartz glass" refers to a quartz glass produced from a silicon compound such as a high purity silane and the like.

On making notice only on the above suppression of heat convection, it may be considered sufficient to provide the translucent layer of the quartz glass crucible entirely made from synthetic quartz glass, however, if this should be done, the temperature of the inner surface plane of the quartz glass crucible becomes too high, and this results in an activation of the reaction at the contact portion between the surface of the quartz glass crucible and the silicon melt, thereby leading to an acceleration of the oscillation of the melt surface. Furthermore, because a synthetic quartz glass is lower in high temperature viscosity as compared with a naturally occurring quartz glass, the above measure is not preferred because it has a negative effect as to lower the thermal resistance of the entire quartz glass crucible. Further, if the entire translucent layer should be made of synthetic quartz glass, it requires an increase in the amount of expensive synthetic powder as the raw material, and is disadvantageous concerning the production cost.

In view of the above reasons, the multilayer structured quartz glass crucible according to the present invention requires that it is made of at least three layers of a translucent outer layer made of naturally occurring quartz glass and having a large number of pores, a translucent intermediate layer free from pores and made of synthetic quartz glass, and a transparent inner layer made of synthetic quartz glass. In addition to these three layers, for instance, it is possible to provide a layer having a specific function as a second or a third intermediate layer, for instance, a layer for preventing the transfer of impurities as disclosed in Japanese Patent Laid-Open No. 255476/1997, or a layer containing a crystallization accelerating agent as disclosed in Japanese Patent Laid-Open No. 171684/1999, etc. in this manner, it is possible to provide a multilayer structure having 4 or 5 layers, or even more layers.

The thickness of the intermediate layer made from a synthetic quartz glass according to the present invention is preferably not more than the thickness of the outer layer made from a naturally occurring quartz glass. If the thickness of the intermediate layer should exceed the thickness of the outer layer, as described above, the thermal resistance relatively decreases, and this leads to a fear of causing insufficiently low strength of the entire crucible at high temperatures; furthermore, it leads to a disadvantageous increase in production cost. However, so long as the effect of the present invention is achieved, the intermediate layer may be provided at a thickness exceeding the range described above.

The thickness of the outer layer made from a naturally occurring quartz glass according to the present invention is preferably 1 mm or thicker but not more than 90% of the total thickness, and more preferably, 2 mm or thicker but not more than 80% of the total thickness. If the outer layer should be provided at a thickness less than 1 mm, there is fear of resulting in a crucible having an insufficiently low strength even though the thickness necessary for the entire quartz glass crucible should be taken into consideration. Further, if the outer layer should be provided thinner while increasing the thickness of the translucent intermediate layer made from a synthetic quartz glass, there generate problems concerning the thermal resistance (strength) and the production cost as described above. However, so long as the effect of the present invention is achieved, the outer layer may be provided at a thickness less than 1 mm.

On the other hand, if the thickness of the outer layer made from a naturally occurring quartz glass according to the present invention should exceed 90% of the thickness of the entire quartz glass crucible, there may occur cases in which the effect of the present invention, i.e., the reduction of the oscillation of the melt surface by minimizing the temperature difference depending on the position of the inner surface of the quartz glass crucible, thereby suppressing the thermal convection of the silicon melt, should not be sufficiently achieved. However, so long as the effect of the present invention is achieved, a constitution as such that the thickness of the outer layer exceeds 90% of the total thickness of the crucible.

The thickness of the intermediate layer made from a synthetic quartz glass above is preferably 0.5 mm or thicker, but not more than 50% of the thickness of the entire quartz glass crucible, and more preferably, it is 1 mm or thicker, but not more than 40% of the thickness of the entire quartz glass crucible.

The thickness of the inner layer made from a synthetic quartz glass above is preferably 0.5 mm or thicker, and more preferably, 1 mm or thicker, but not more than 70% of the thickness of the entire quartz glass crucible. Furthermore, in the inner layer, the average OH concentration in a range from the inner surface to a depth of 1 mm is preferably in a range of from 100 wt.-ppm to 400 wt.-ppm.

A first embodiment of the method for producing a multilayer structured quartz glass crucible according to the present invention is characterized by that it comprises: a step of forming an outer layer and an intermediate layer, comprising supplying a powder of natural raw material inside a rotating mold, then supplying a powder of synthetic raw material to form an intermediate layer molded body in the shape of a crucible on the inner surface of said outer layer molded body, thereby obtaining a double layered molded body, followed by heating and fusing the resulting double layered molded body to obtain a translucent outer layer made of a naturally occurring quartz glass and a translucent intermediate layer made of a synthetic quartz glass; and a step of forming an inner layer by newly supplying a powder of a synthetic quartz raw material into the heated atmosphere inside the outer layer and the intermediate layer during or after forming said outer layer or intermediate layer, thereby forming a transparent inner layer made of a synthetic quartz glass on the inner plane side of said intermediate layer.

A second embodiment of the method for producing a multilayer structured quartz glass crucible according to the present invention is characterized by that it comprises: a step of forming an outer layer, comprising supplying a powder of natural raw material inside a rotating mold and thereby obtaining an outer layer molded body in the shape of a crucible, followed by fusing said outer layer molded body to form a translucent outer layer made of a naturally occurring quartz glass; a step of forming an intermediate layer, comprising, after forming the outer layer, supplying a powder of a synthetic raw material to the inner plane side of said outer layer and thereby obtaining an intermediate layer molded body in the shape of a crucible, followed by fusing said intermediate layer molded body to form a translucent intermediate layer made of synthetic quartz glass on the inner plane side of said outer layer; and a step of forming an inner layer, comprising, newly supplying a powder of synthetic quartz raw material into the heated atmosphere inside said intermediate layer during or after forming said intermediate layer, thereby forming a transparent inner layer made of a synthetic quartz glass on the inner plane side of said crucible intermediate layer.

In the first and second embodiment, all the method steps during which a powder of raw material is supplied inside the rotating mold may be done by taking advantage of the centrifugal force.

As a raw material powder for use in the quartz glass crucible according to the present invention, usable are various types of powders properly selected from a (crystalline) naturally occurring quartz powder, a (crystalline) synthetic quartz powder, a naturally occurring quartz glass powder, a synthetic quartz glass powder, etc. For instance, a naturally occurring quartz powder obtained by crushing and purifying a naturally occurring rock crystal or silica sand and silica rock, etc., is suitable for use as a raw material forming the outer layer of the quartz glass crucible according to the present invention because it not only provides economical advantage, but also (the quartz glass obtained therefrom) has advantages such as an excellent heat resistance.

A powder with higher purity, i.e., a synthetic quartz glass powder, is suitable for use as a raw material for forming the inner layer and the intermediate layer of the crucible. More specifically, usable is a powder properly selected from synthetic quartz glass powders obtained by means of a solgel process, soot process, flame combustion method, etc., from starting materials such as silicon alkoxide, a silicon halide (e.g., silicon tetrachloride, etc.), sodium silicate, and other silicon compounds. In addition to above, also usable are fumed silica, silica precipitates, etc.

Furthermore, in addition to a vetrified naturally occurring quartz powder or a crystallized synthetic quartz glass powder, also usable as the raw material for producing the outer layer as well as the inner and the intermediate layers are, for instance, a mixture of a naturally occurring quartz glass powder, a synthetic quartz powder, or various types of powders described above; as well as a powder containing an element (e.g., an aluminum compound, etc.) which contributes to the acceleration of crystallization or to the shielding of impurities, etc., depending on the desired physical properties (the state of the pores, the density, surface state, etc.) of the quartz glass crucible to be produced.

More specifically, usable as the raw material powder for forming each of the layers of the multilayer structured quartz glass crucible of the invention are silicon dioxide powders and the like enumerated below. Suitable for use as the raw material powder for producing the outer layer is a powder of naturally occurring quartz, and also usable are other naturally occurring raw material powders such as a powder of naturally occurring quartz glass, a powder of a naturally occurring quartz or a naturally occurring quartz glass containing a specific element, or a mixture thereof. As the raw material powder suitably used for forming the inner and the intermediate layers, suitable is a synthetic quartz glass powder, and also usable are other synthetic raw material powders such as a synthetic quartz powder, a synthetic quartz glass powder or a synthetic quartz powder containing a specific element, or a mixture thereof.

MODE OF PRACTICING THE INVENTION

An embodiment according to the present invention is described below by making reference to the attached drawings. It should be understood, however, that the drawn embodiment is provided as an example, and that various modifications can be made thereto so long as the modifications does not deviate from the technical idea of the present invention.

FIRST EMBODIMENT

Figure 1:
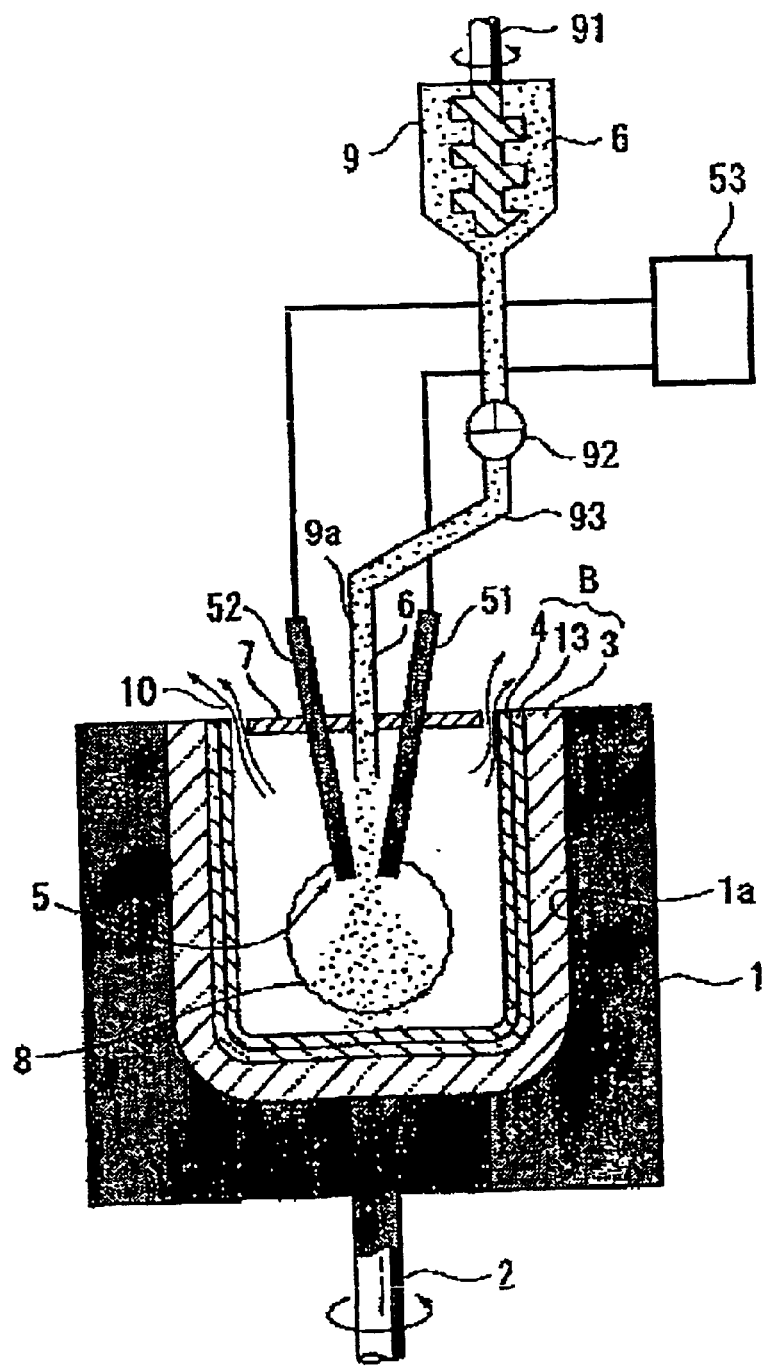
FIG. 1 is a schematic explanatory diagram showing a cross section view of an apparatus for use in practicing the method for producing a quartz glass crucible according to the present invention and a method for producing a quartz glass crucible using said apparatus.
Figure 2:
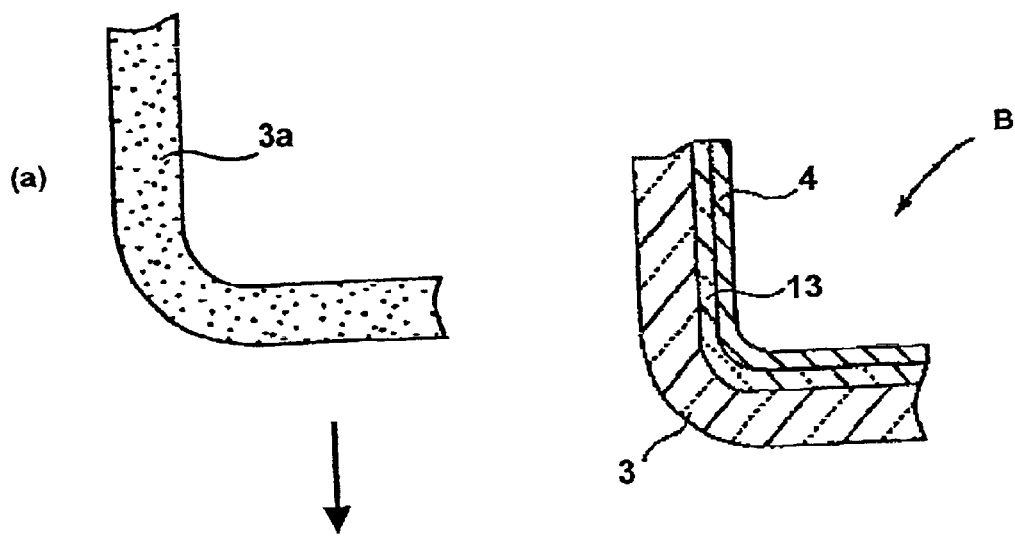
FIG. 2 is a partial cross section view of a three-layer structured quartz glass crucible according to an example of the present invention.
Figure 3:
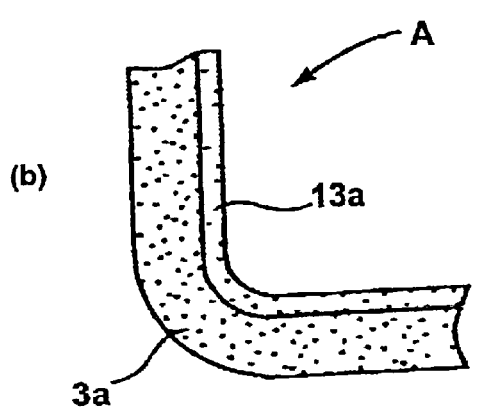
FIG. 3 is a diagram showing the process steps for producing a quartz glass crucible according to a first embodiment of the present invention.
Figure 3:
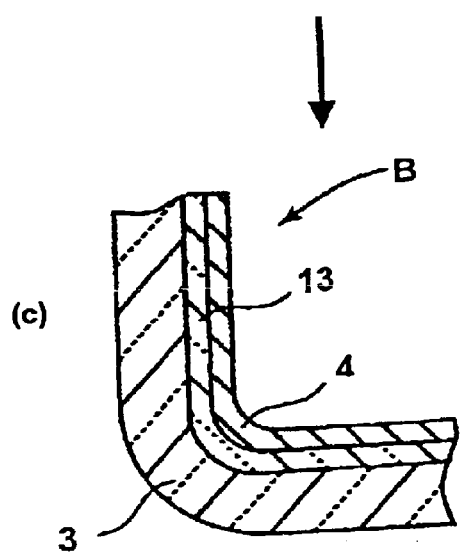

Referring to FIGS. 1, 2, and 3, the process for producing a multilayer structured quartz glass crucible according to a first embodiment of the method for producing a quartz glass crucible of the present invention is explained below.

Referring to FIG. 1, a rotatable mold 1 is equipped with a rotating shaft 2, and a cavity 1a is formed in the mold 1. Firstly, an outer layer molded body 3a in a crucible shape having a desired thickness is molded by supplying a naturally occurring quartz powder inside the cavity 1a provided to the rotating mold 1, and by applying centrifugal force thereto. Subsequently, a synthetic quartz glass powder is supplied to the inner side of the resulting outer layer molded body 3a made of a naturally occurring quartz powder to obtain an intermediate molded body 13a made of the synthetic quartz glass powder layer formed at a desired thickness along the inner side of the outer layer molded body 3a. Then, thus obtained double layered molded body A is heated and fused from the inner side thereof by using arc discharge, and, after starting or almost simultaneously with the fusion, a synthetic quartz glass powder 6 is newly supplied to the high temperature gaseous atmosphere 8 inside the double structured molded body A through a nozzle 9a. In this manner, the double layered molded body A is fused and vitrified to form a crucible outer layer 3 made of translucent quartz glass and an intermediate layer 13. At the same time, at least a part of the newly supplied synthetic quartz glass powder 6 undergoes melting and is scattered to the inner wall plane of the intermediate layer 13 by the heat inside the high temperature gaseous atmosphere 8, where the molten and scattered synthetic quartz glass adheres to the inner wall plane to form a substantially pore-free transparent quartz glass inner layer 4 on the inner side of the intermediate layer 13.

In this manner, a quartz glass crucible B according to the present invention having three layers, i.e., a translucent outer layer 3 made of a naturally occurring quartz glass obtained by fusing a naturally occurring quartz powder and containing numerous pores, a translucent intermediate layer 13 made of a pore-free synthetic quartz glass obtained by fusing a synthetic quartz glass powder, and a transparent inner layer 4 made of a synthetic quartz glass obtained by fusing a synthetic quartz glass powder, can be produced in accordance with the first embodiment of the production method of the present invention.

For the heating from the inner plane, an arc discharge apparatus 5 equipped with carbon electrodes 51 and 52 connected to a power source 53 as shown in FIG. 1 can be used. A plasma discharge apparatus can be used in the place of the arc discharge apparatus 5. For the production of the base body 3, details can be found in Japanese Patent Publication No. 22861/1992.

Referring to FIG. 1, in order to form the inner layer 4, the apparatus is equipped with a tank for supplying quartz powder containing therein a synthetic quartz glass 6 on the upper side of the mold 1. The supply tank 9 is connected to a discharge pipe 93 provided with a measuring feeder 92. A stirring blade 91 is placed inside the supply tank 9. The upper side of the mold is covered by a lid body 7 except for a portion for performing evacuation 10.

After forming the base body 3, or during the formation of the base body 3, a synthetic quartz glass powder is supplied through a supply pipe 93 to the inside of the base body 3 by opening the measuring feeder 92 to an adjusted aperture to supply the synthetic quartz glass powder 6 while continuing heating by means of discharge generated from the carbon electrodes 51 and 52 of the arc discharge apparatus 5. By operating the arc discharge apparatus 5, a high temperature gaseous atmosphere 8 is formed inside the base body 3. Thus, the synthetic quartz glass powder 6 is supplied to the high temperature gaseous atmosphere 8.

The high temperature gaseous atmosphere as referred herein is an atmosphere formed around the arc discharge generated by the carbon electrodes 51 and 52, and yields a temperature sufficiently high for melting quartz glass; i.e., it is heated to a temperature as high as two thousands and several hundreds degrees.

For the details of the method for forming the outer layer (base body) 3 and the inner layer 4 (exclusive of the intermediate layer 13), reference can be made to Japanese Patent Publication No. 22861/1992 referred above.

Second Embodiment

Figure 4:
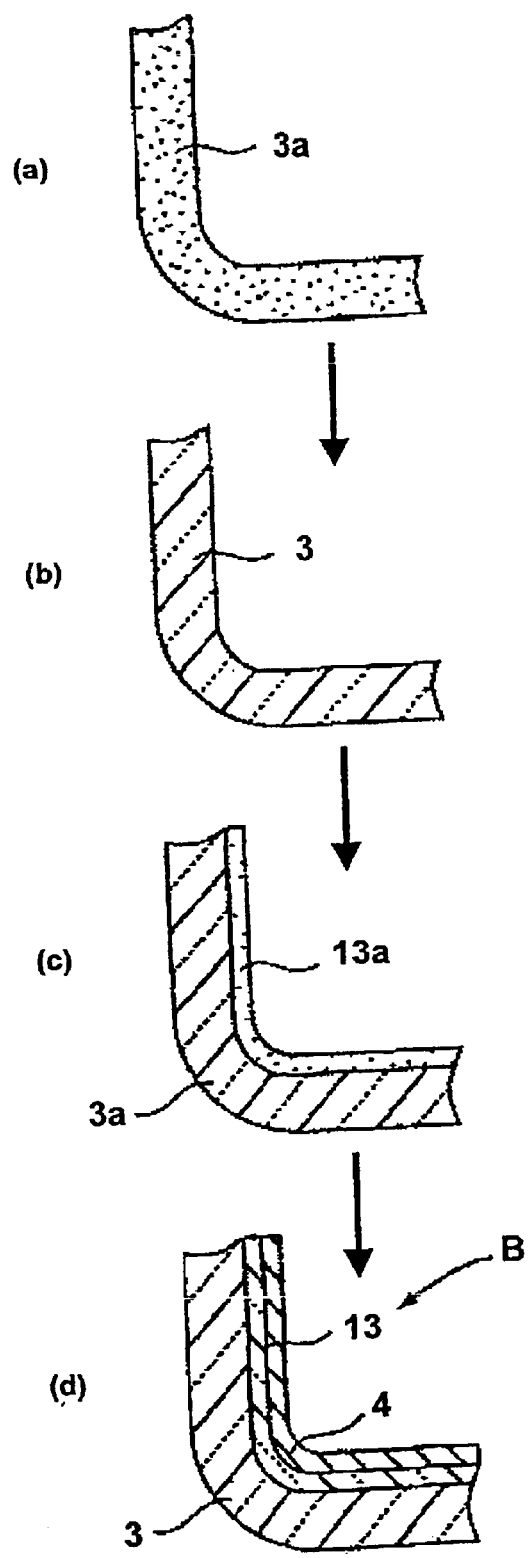
FIG. 4 is a diagram showing the process steps for producing a quartz glass crucible according to a second embodiment of the present invention.

Then, by making reference to FIGS. 1, 2, and 4, the process for producing a multilayer structured quartz glass crucible according to a second embodiment of the method for producing a quartz glass crucible of the present invention is explained below.

Firstly, an outer layer molded body 3a is molded into a shape of a crucible by supplying a naturally occurring quartz powder inside the cavity 1a provided to the rotating mold 1 while applying centrifugal force thereto. Subsequently, after forming an outer layer 3 made of a naturally occurring quartz glass by heating and fusing from the inner side, a synthetic quartz glass powder is supplied to the inner side of the resulting outer layer 3 to obtain an intermediate molded body 13a made of synthetic quartz glass powder at a desired thickness. Then, while heating and fusing the intermediate layer molded body 13a from the inner side by using arc discharge, a synthetic quartz glass powder 6 is supplied to the high temperature gaseous atmosphere 8 inside the intermediate molded body 13a through a nozzle 9 after starting or simultaneously with the fusion. In this manner, the intermediate layer molded body 13a undergoes fusion and vitrification to form a translucent intermediate layer 13 made of synthetic quartz glass on the inner side of the translucent outer layer 3 made of a naturally occurring quartz glass, while, similar to the case described in the first embodiment above, at least a part of the newly supplied synthetic quartz glass powder 6 undergoes melting and is scattered to the inner wall plane of the intermediate layer 13 by the heat inside the high temperature gaseous atmosphere 8, where the molten and scattered synthetic quartz glass adheres to the inner wall plane to form a substantially pore-free transparent quartz glass inner layer 4 on the inner side of the intermediate layer 13.

In this manner, a quartz glass crucible B according to the present invention having three layers, i.e., a translucent outer layer 3 made of a naturally occurring quartz glass obtained by fusing a naturally occurring quartz powder, a translucent intermediate layer 13 made of a synthetic quartz glass obtained by fusing a synthetic quartz glass powder, and a transparent inner layer 4 made of a synthetic quartz glass obtained by fusing a synthetic quartz glass powder, can be produced in accordance with the second embodiment of the production method of the present invention.

The first embodiment according to the method of the present invention comprises simultaneously performing the heating and fusing of the outer layer 3 and the intermediate layer 13, and is therefore advantageous over the second embodiment in which the heating and fusing of the layers are carried out separately. On the other hand, the second embodiment is advantageous in that the properties of the layers can be freely controlled, because the heating and fusing conditions for the outer layer 3 and the intermediate layer 13 can be set independent to each other.

EXAMPLES

The present invention is described more specifically below by the way of examples, but it should be understood that they are by no means limiting the present invention.

Example 1

By using the apparatus shown in FIG. 1 and in accordance with the method illustrated in FIG. 3, a naturally occurring quartz powder was supplied inside a rotating mold to obtain an outer layer molded body comprising a powder layer 30 mm in thickness, and a synthetic quartz glass powder was subsequently supplied thereto to form an intermediate layer molded body 1.5 mm in thickness comprising the synthetic quartz glass powder provided along the inner side of the outer layer molded body. Thus was obtained a molded body having a double layer structure.

Then, at the same time with heating and fusing the double layered structured molded body from the inner side by means of arc discharge, a synthetic quartz glass powder, as a material for forming the transparent layer, was newly supplied into the high temperature gaseous atmosphere at a rate of 100 g/min to obtain a three-layer structured quartz glass crucible 22 inch in diameter. The thus obtained three-layer structured quartz glass crucible consisted of a 8 mm thick translucent outer layer made of a naturally occurring quartz glass, a 1 mm thick translucent intermediate layer made of a synthetic quartz glass, and a 1 mm thick transparent inner layer made of a synthetic quartz glass; it thereby resulted in a total thickness of 10 mm. On filling the quartz glass crucible with polysilicon and performing pulling up of a single crystal silicon after melting the polysilicon, a stable pulling up could be carried out as shown in Table 1, without generating any oscillation on the surface of the silicon melt.

Example 2

By a method similar to that described in Example 1, a naturally occurring quartz powder was supplied to the inside of a rotating mold to form an outer layer molded body consisting of a powder layer 25 mm in thickness, and a synthetic quartz glass powder was subsequently supplied to form an intermediate molded body comprising a synthetic quartz glass powder in a thickness of 5 mm formed along the inner side of the outer layer molded body. Thus was obtained a double layered molded body.

Then, at the same time with heating and fusing the double layered structured molded body from the inner side by means of arc discharge, a synthetic quartz glass powder was newly supplied into the high temperature gaseous atmosphere at a rate of 100 g/min to obtain a three-layer structured quartz glass crucible 22 inch in diameter consisting of a 5 mm thick translucent outer layer made of a naturally occurring quartz glass, a 4 mm thick translucent intermediate layer made of a synthetic quartz glass, and a 1 mm thick transparent inner layer made of a synthetic quartz glass; it thereby resulted in a total thickness of 10 mm. On performing pulling up of a single crystal silicon in a manner similar to that described in Example 1 using this quartz glass crucible, a stable pulling up could be carried out as shown in Table 1, without generating any oscillation on the surface of the silicon melt.

Example 3

By a method similar to that described in Example 1, a naturally occurring quartz powder was supplied to the inside of a rotating mold to form an outer layer molded body consisting of a powder layer 20 mm in thickness, and a synthetic quartz glass powder was subsequently supplied to form an intermediate molded body comprising a synthetic quartz glass powder layer 1.5 mm in thickness formed along the inner side of the outer layer molded body. Thus was obtained a double layered molded body.

Then, at the same time with heating and fusing the double-layer structured molded body from the inner side by means of arc discharge, a synthetic quartz glass powder was newly supplied into the high temperature gaseous atmosphere at a rate of 300 g/min to obtain a three-layer structured quartz glass crucible 22 inch in diameter. The thus obtained three-layer structured quartz glass crucible consisted of a 2 mm thick translucent outer layer made of a naturally occurring quartz glass, a 1 mm thick translucent intermediate layer made of a synthetic quartz glass, and a 7 mm thick transparent inner layer made of a synthetic quartz glass; it thereby resulted in a total thickness of 10 mm. On performing pulling up of a single crystal silicon in a manner similar to that described in Example 1 using this quartz glass crucible, a stable pulling up could be carried out as shown in Table 1, without generating any oscillation on the surface of the silicon melt.

Comparative Example 1

By a method similar to that described in Example 1, a naturally occurring quartz powder was supplied to the inside of a rotating mold to form a molded body consisting of only naturally occurring quartz powder. Then, at the same time with heating and fusing the molded body from the inner side by means of arc discharge, a synthetic quartz glass powder was newly supplied into the high temperature gaseous atmosphere at a rate of 100 g/min to obtain a double-layer structured quartz glass crucible 22 inch in diameter. The double-layer structured quartz glass crucible consisted of a 9 mm thick translucent outer layer made of a naturally occurring quartz glass and a 1 mm thick transparent inner layer made of a synthetic quartz glass; it thereby resulted in a total thickness of 10 mm. Pulling up of a single crystal silicon was attempted in a manner similar to that described in Example 1 using this quartz glass crucible, but the process was stopped before accomplishment because serious oscillation generated on the surface of the silicon melt as shown in Table 1.

TABLE 1

|  | Ex. 1 | Ex. 2 | Ex. 3 | Comp. Ex. 1 |
|---|---|---|---|---|
| Translucent naturally occurring quartz glass outer layer (mm) | 8 | 5 | 2 | 9 |
| Translucent synthetic quartz glass intermediate layer (mm) | 1 | 4 | 1 | — |
| Transparent synthetic quartz glass inner layer (mm) | 1 | 1 | 7 | 1 |
| Oscillation of melt surface | None | None | None | Occurred |

Effect of the Invention

As described above, in accordance with the multilayer structured quartz glass crucible according to the present invention suppresses the oscillation of the silicon melt surface on pulling up a single crystal silicon, and hence it effectively enables a stable pulling up of a single crystal silicon at a high production yield. Furthermore, the production method of the quartz glass crucible according to the present invention enables an efficient production of the multilayer structure quartz glass crucible above.

What is claimed is:

1. A multilayer structured quartz glass crucible comprising:
   a translucent outer layer made of naturally occurring quartz glass,
   a translucent intermediate layer inward of the outer layer and made of synthetic quartz glass, and
   a transparent inner layer inward of the intermediate layer and made of synthetic quartz glass.

2. A multilayer structured quartz glass crucible as claimed in claim 1, wherein said intermediate layer and the outer layer each have a thickness, and the thickness of said intermediate layer is not more than that of the outer layer.

3. A multilayer structured quartz glass crucible as claimed in claim 2, wherein said outer layer has a thickness of 1 mm or more but not more than 90% of a total thickness of the entire quartz glass crucible.

4. A multilayer structured quartz glass crucible as claimed in claim 3, wherein the thickness of said inner layer is 0.5 mm or more but not more than 70% of the total thickness of the entire quartz glass crucible.

5. A multilayer structured quartz glass crucible as claimed in claim 2, wherein the thickness of said intermediate layer is 0.5 mm or more but not more than 50% of a total thickness of the entire quartz glass crucible.

6. A multilayer structured quartz glass crucible as claimed in claim 5, wherein the thickness of said inner layer is 0.5 mm or more but not more than 70% of the total thickness of the entire quartz glass crucible.

7. A multilayer structured quartz glass crucible as claimed in claim 2, wherein the thickness of said inner layer is 0.5 mm or more but not more than 70% of a total thickness of the entire quartz glass crucible.

8. A multilayer structured quartz glass crucible as claimed in claim 1, wherein said outer layer has a thickness of 1 mm or more but not more than 90% of a total thickness of the entire quartz glass crucible.

9. A multilayer structured quartz glass crucible as claimed in claim 8, wherein the thickness of said intermediate layer is 0.5 mm or more but not more than 50% of the total thickness of the entire quartz glass crucible.

10. A multilayer structured quartz glass crucible as claimed in claim 9, wherein the thickness of said inner layer is 0.5 mm or more but not more than 70% of the total thickness of the entire quartz glass crucible.

11. A multilayer structured quartz glass crucible as claimed in claim 8, wherein the thickness of said inner layer is 0.5 mm or more but not more than 70% of the total thickness of the entire quartz glass crucible.

12. A multilayer structured quartz glass crucible as claimed in claim 1, wherein the intermediate layer has a thickness of 0.5 mm or more but not more than 50% of a total thickness of the entire quartz glass crucible.

13. A multilayer structured quartz glass crucible as claimed in claim 12, wherein the thickness of said inner layer is 0.5 mm or more but not more than 70% of the total thickness of the entire quartz glass crucible.

14. A multilayer structured quartz glass crucible as claimed in claim 1, wherein said inner layer has a thickness of 0.5 mm or more but not more than 70% of the total thickness of the entire quartz glass crucible.

* * * * *